United States Patent
Chari et al.

(10) Patent No.: US 8,731,216 B1
(45) Date of Patent: May 20, 2014

(54) AUDIO NORMALIZATION FOR DIGITAL VIDEO BROADCASTS

(75) Inventors: Santhana Chari, Mableton, GA (US); Alexander D. Raji, Alpharetta, GA (US)

(73) Assignee: AARIS Enterprises, Inc., Suwanee, GA (US)

( * ) Notice: Subject to any disclaimer, the term of this patent is extended or adjusted under 35 U.S.C. 154(b) by 0 days.

(21) Appl. No.: 13/275,229

(22) Filed: Oct. 17, 2011

Related U.S. Application Data

(60) Provisional application No. 61/393,582, filed on Oct. 15, 2010.

(51) Int. Cl.
*H03G 3/00* (2006.01)
*G01L 21/00* (2006.01)

(52) U.S. Cl.
USPC .......................................... 381/104; 704/225

(58) Field of Classification Search
USPC .......... 348/515, 180, 192, 193; 381/102, 104, 381/107; 700/94; 704/501, 225; 375/240.26, 240.27; 370/480
See application file for complete search history.

(56) References Cited

U.S. PATENT DOCUMENTS

| | | | |
|---|---|---|---|
| 6,865,164 B1 * | 3/2005 | Scribano et al. | 370/328 |
| 7,076,274 B2 * | 7/2006 | Jollota et al. | 455/561 |
| 7,398,207 B2 * | 7/2008 | Riedl | 704/225 |
| 2004/0044525 A1 * | 3/2004 | Vinton et al. | 704/224 |
| 2005/0078840 A1 * | 4/2005 | Riedl | 381/104 |
| 2009/0067644 A1 * | 3/2009 | Crockett et al. | 381/98 |
| 2009/0074209 A1 * | 3/2009 | Thompson et al. | 381/107 |
| 2009/0304190 A1 * | 12/2009 | Seefeldt et al. | 381/56 |

* cited by examiner

*Primary Examiner* — Victor Kostak
(74) *Attorney, Agent, or Firm* — Troy A. Van Aacken

(57) ABSTRACT

Systems and methods of this disclosure can operate to provide audio level normalization in multimedia streams. In some implementations, audio level normalization can include partially decoding audio frames included in a multimedia stream, calculating an average energy level of the partially decoded frames, comparing the average energy level of the partially decoded frames to a nominal energy level, modifying a dialnorm setting associated with the multimedia stream, and reencoding the partially decoded audio frames for inclusion as a modified audio stream corresponding to the video stream.

21 Claims, 7 Drawing Sheets

AC-3 Frame Dialnorm Calculation

AUDIO NORMALIZATION FOR DIGITAL VIDEO BROADCASTS

TECHNICAL FIELD

This disclosure is related to providing audio normalization for broadcast video.

BACKGROUND

In digital multimedia transport, audio content is encoded in a variety of compression schemes. One of the most popular compression schemes is Dolby Digital (AC-3) audio. Dolby Digital AC-3 audio is outlined by ATSC standards document A/52B, Digital Audio Compression standard (AC-3, E-AC-3) Revision B, Jun. 14, 2005, which is hereby incorporated by reference. A feature supported by AC-3 audio is dialog normalization ("dialnorm") value. Dialnorm value is an indication of audio program loudness. Currently the dialnorm value is calculated by special purpose equipment for an entire video program file. The dialnorm is encoded as a 5-bit field in every AC-3 audio frame. The valid values for dialnorm range from 1 to 31 that correspond to dialogue levels of −1 dB to −31 dB, respectively. The definition of the dialnorm as specified in the standard referenced above is an indication of the subjective loudness of normal spoken dialogue compared to 100 percent digital reproduction.

Dialnorm interpreted by the audio decoder as an indication of the audio content loudness. The dialnorm value can be interpreted by the audio decoder and is used to automatically adjust the volume of the decoded audio down to keep constant dialogue loudness. In general a decrease of 1 dB in the encoded dialnorm value (ranging from 1 to 31) would cause a drop of 1 dB in the decoder output gain level. A value of 31 in the dialnorm field indicates no gain loss due to dialogue normalization in the decoder output.

SUMMARY

Systems and methods for audio normalization in digital broadcasts are provided. Methods can include partially decoding audio frames included in a multimedia stream, calculating an average energy level of the partially decoded frames, comparing the average energy level of the partially decoded frames to a nominal energy level, modifying a dialnorm setting associated with the multimedia stream, and reencoding the partially decoded audio frames for inclusion as a modified audio stream corresponding to the video stream. Other systems and methods can be used to implement the teachings of this disclosure.

DETAILED DESCRIPTION

Figure 1:
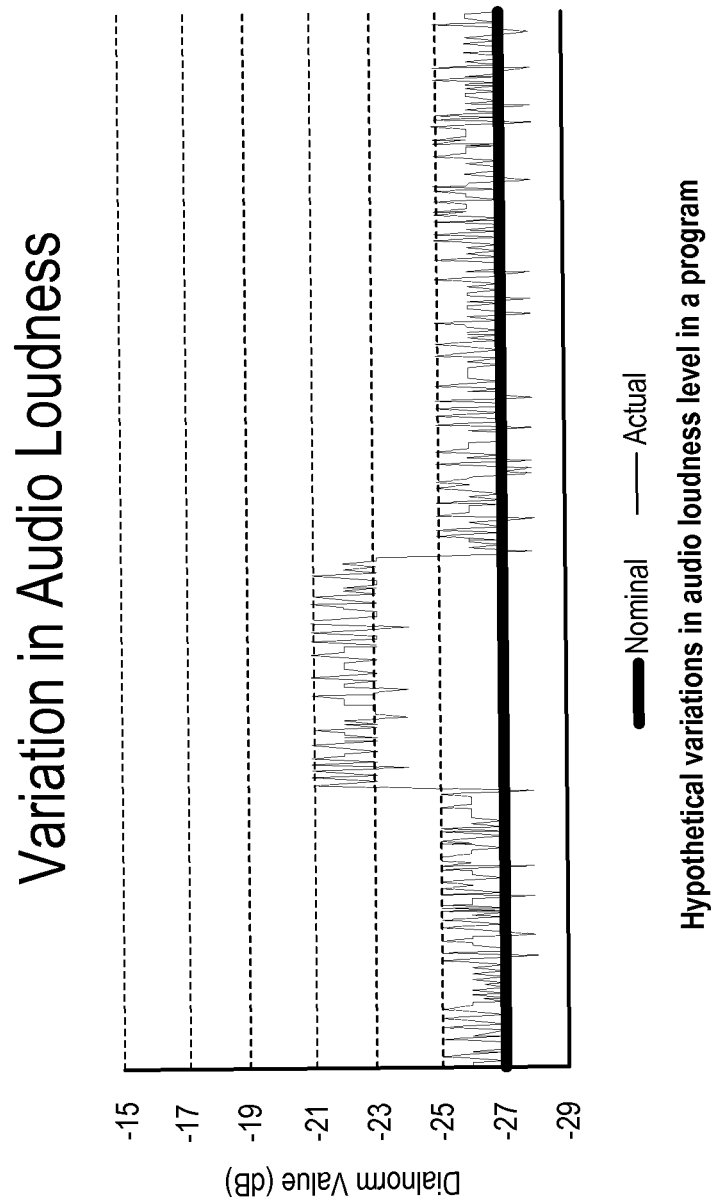
FIG. 1 is a graph depicting example variations in audio loudness level in a program.

In a typical television broadcast production, each broadcast program can be evaluated for audio loudness level and proper dialog normalization value can be set in order to conform to a constant overall television station audio level. However, some television program segments (e.g., advertisements) are produced externally or added later in the re-broadcaster head-end (as in local advertising in a national program); therefore, the programming may not all comply with the television broadcaster original audio level settings. This may be noticeable when viewing a television channel where advertisements are often louder than the main program. This fluctuation between program audio loudness is annoying to the viewer since it requires the viewer to adjust the volume down and up to their listening comfort level.

A similar problem can exist between channels in a channel line-up of a re-broadcaster. For example, a viewer changing channels many want to change the volume level when changing channels because of different audio levels.

However, if a television (multimedia) broadcast is identified as a series of concatenated video programs from different sources with varying audio loudness levels, the dialnorm value can be used reduce or eliminate the annoyance of the viewer when he/she has to adjust the volume for each program in the broadcast.

Overview of Audio Level Normalization

In a digital video transcoder/re-coder such as a video encoding/transcoding platform (e.g., the VIPr platform, which is available from ARRIS, Inc. of Suwanee, Ga.), there is an opportunity to measure and adjust the audio dialnorm value for the end-user, such that the television viewing experience is more consistent. The encoder/transcoder, with ad insertion capability, can reside in a point in the television broadcast network that can make the last adjustment to the dialnorm level before the ultimate viewer hears the final form of the television broadcast.

As depicted in the example shown in Error! Reference source not found.1, the dialnorm value for a program segment may indicate a constant level around −27 dB, while measurements would reveal a moving average centered around −26 dB with a rise to −21 dB during an advertisement. In such instances, the encoder/transcoder can adjust the dialnorm to the appropriate value of 21 during the rise in the audio level and back to the nominal 27 dB when the loud segment had ended.

In some implementations, it should be noted that despite the measurement difference of −26 vs. the nominal −27 dialogue level, the encoder/transcoder can compare the difference to a threshold difference before making a determination to adjust the dialnorm value. For example, where the measured level is −26, the specified level is −27 and a threshold is ±5-10%, the encoder/transcoder would not change the dialnorm value since this difference would be considered to be below the threshold.

In other implementations, the encoder/transcoder may use a measurement error threshold. In such implementations, measured levels that fall within the measurement error of the dialnorm level would not result in a dialnorm value adjustment to the broadcast stream.

Example Implementation of Audio Normalization Feature
Dialogue Level Versus Audio Annoyance Level Since the encoder/transcoder needs to re-measure the perceptible audio loudness on an ongoing basis, a decision can be made whether to limit the measurement to human spoken dialogue frequencies or extend the measurement to all audible frequencies. In general, the annoyance level of the audio may emanate from other frequencies than the spoken dialogue. Spoken dialogue is typically considered to be in the 1.5 KHz to 3 KHz range. In some implementations, the encoder/transcoder measures the audio normalization level in terms of all human audible frequencies instead of only human dialogue frequency range.

Human Hearing and Psychoacoustic Model

A human ear is typically considered to be able to hear sounds ranging from 20 Hz to 20,000 Hz. However this sound perception does not follow a linear pattern. As measurements have shown, human ear is more sensitive to some frequencies than others. Therefore, the same sound pressure at different frequencies may have different psychoacoustic response and be perceived to have different loudness level to a human.

Figure 2:
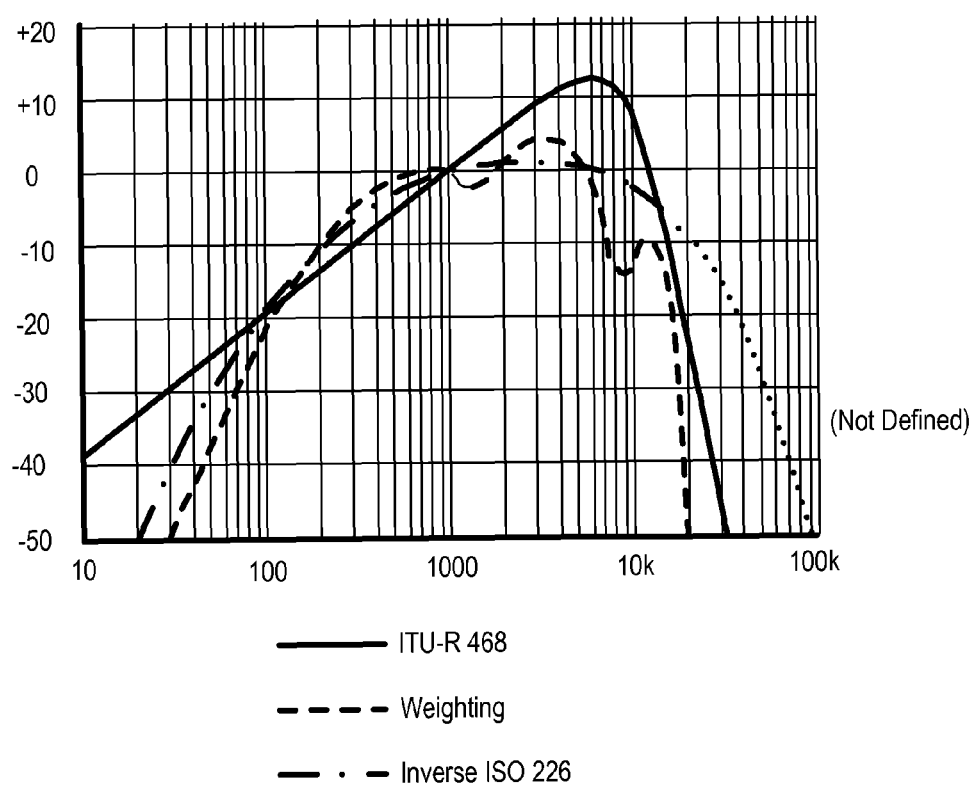
FIG. 2 is a graph depicting various psychoacoustic modeling standards and human hearing models.

As shown in FIG. 2, various models have been developed and some are standardized to represent the best aggregate human ear frequency response. These models include ITU-R 468, A-weighting and Inverse ISO 226, each of which is incorporated herein by reference. In some implementations, these models can be used in conjunction with the dialnorm value to adjust volume based on frequency.

Measuring Audio Peak Loudness

There are also a number of standardized recommendations for measuring audio loudness that require a multi-channel (stereo or surround) audio stream to be fully decoded and loudness level to be calculated using a particular psychoacoustic model's parameters. One such standard is ITU-R BS.1770-1, which is incorporated herein by reference. The encoder/transcoder can use a simpler and less computationally intensive implementation method that via calibration would yield similar results to the ITU-R.1770-1 algorithm.

AC-3 Frame Structure and Frequency Band Coefficients

An AC-3 compressed audio structure is briefly described in this section. An AC-3 audio stream is composed of a series of audio frames transmitted serially in decode time order. AC-3 like many modern audio compression algorithms uses Code Excited Linear Prediction (CELP) technology, where data from the audio stream is converted into the frequency domain. Then, the excitation levels at pre-determined frequency bands are encoded in an audio frame.

Each frame can represent a fixed time interval of audio program. Within each frame reside header information and data for 6 audio blocks. The header section carries information about the audio stream length, encoding format, and other attributes including dialnorm value. The rest of the AC-3 frame contains compressed audio data in form of six separate blocks. Each block represents 256 samples of digital audio. Therefore, each frame can be converted to 6×256=1536 samples of audio for each channel (output speaker).

Each block in the AC-3 frame can include information about the compression strategy used and compressed data representing the audio signal strength for up to 256 consecutive frequency bands ranging from 20 Hz to 20,000 Hz. Each frequency coefficient can represents the energy level in each of the 78.25 Hz sub-bands. Moreover, these coefficients can represent the raw audio level at each frequency band before various gain control and dialog normalization adjustments are applied.

Partial Decoding of AC-3 Frame Structure to Yield Frequency Band Coefficients

In some implementations, the encoder/transcoder audio loudness measurement can use partial decoding of the AC-3 audio frames to identify an RMS (root mean square) energy level for each frequency band that represents all audio channels (speakers). The encoder/transcoder can then calculate an average for the RMS energy level of the partially decoded frames across the 6 blocks of audio in each AC-3 frame. The energy level in the respective frequency bands can be further adjusted using the ITU R-468 psychoacoustic model, incorporated herein by reference, to adjust the energy levels in each frequency band based in the human hearing characteristics.

The encoder/transcoder audio normalization software can use an off the shelf AC-3 decoder software that is modified to yield the desired frequency band coefficients. Use of such decoder software can greatly reduce the CPU overhead by not fully decoding the audio to multichannel PCM values and computing the loudness using ITU-R BS.1770-1 algorithm.

In order to gain comparable results to the industry standard algorithm for loudness measurement, some implementations can include an additional calibration step that would use a table mapping of actual measurements for each method.

Silence Rejection Algorithm

Most audio programs include periods of silence. If these periods of low audio level are included in the audio peak level measurements, the user would get an unrealistically low peak level due to these periods of low energy. Since the purpose of the audio level measurement is to calculate the annoyance level of the audio program, the silence periods are typically excluded from the calculation.

Figure 3:
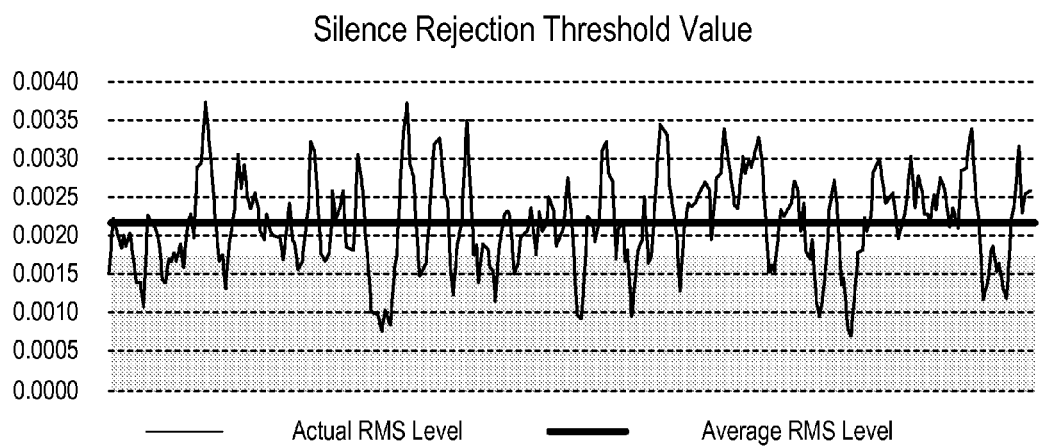
FIG. 3 is a graph depicting a silence rejection algorithm based on a power threshold.

In some implementations, the audio peak level measurement can use a threshold at a fixed distance from the average audio energy level to detect relatively silent periods in the audio program and exclude the values in these regions of the audio program from peak level calculation. For example, in FIG. 3, energy levels residing in the shaded region can be eliminated from the calculation of the average RMS level.

Audio Level Adjustment Look Ahead Algorithm

In practice the loudness measurements can be averaged over a period of time. If these measurements are not averaged over a period of time, the normal variation of any audio program can be suppressed. The approximate time window used for examples of the encoder/transcoder audio normalization is 3 seconds. However, it should be understood that the averaging window can be somewhat variable in various implementations, for example, due to the silence rejection algorithm described above.

Figure 4:
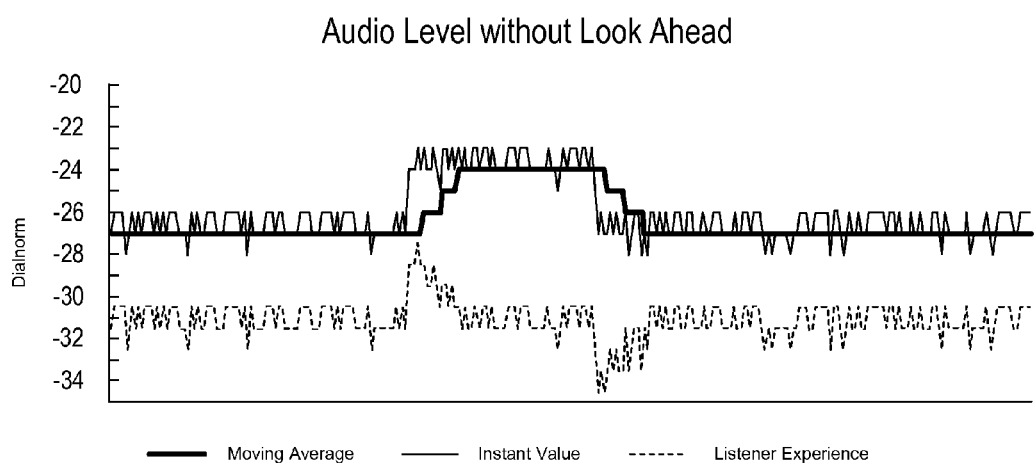
FIG. 4 is a graph depicting audio level adjustment without a look ahead feature.
Figure 5:
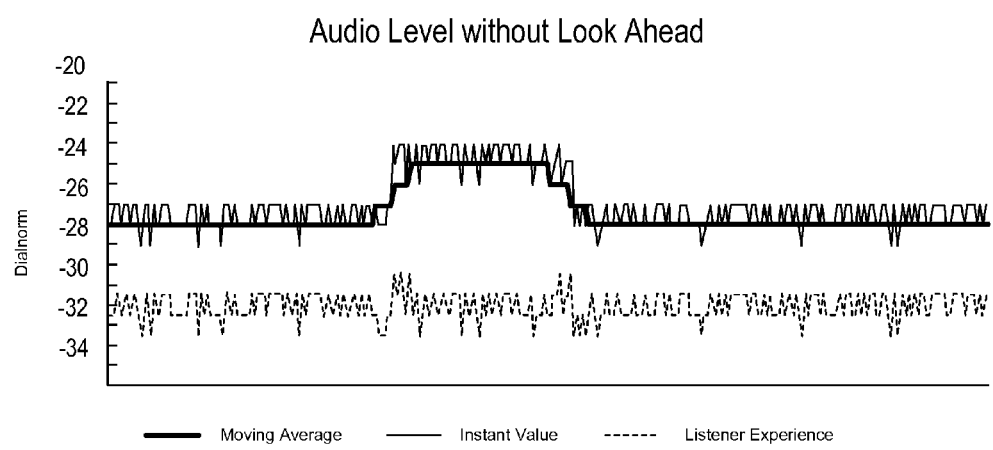
FIG. 5 is a graph depicting audio level adjustment with a look ahead feature.

In an example where there is a step rise in the audio loudness, the averaging algorithm would rise steadily to indicate the new loudness level after the averaging window has expired. The listener experience is shown in an example depicted in FIGS. 4 and 5. Without look ahead, the moving average might be slow to rise to the new audio level and slow to return to the original level. As a result the listener will experience a momentary rise in the volume at the start of the louder program and a momentary drop in the audio level after the end of the loud segment.

A few seconds of look ahead in the audio stream will effectively reduce the impact of these rises and dips while the audio normalization actively adjusts the dialnorm value. The look ahead can work to reduce the lag in audio level adjustment that is inevitable with a time averaging mechanism.

Audio Normalization Software Design

VIPR Audio Pipeline Modification

In some implementations, performing a partial decode of the AC-3 audio frames and possibly modifying the dialog normalization value in the audio frame, the audio transport packet stream can be converted to the original elementary stream in the form of consecutive audio frames.

Figure 6:
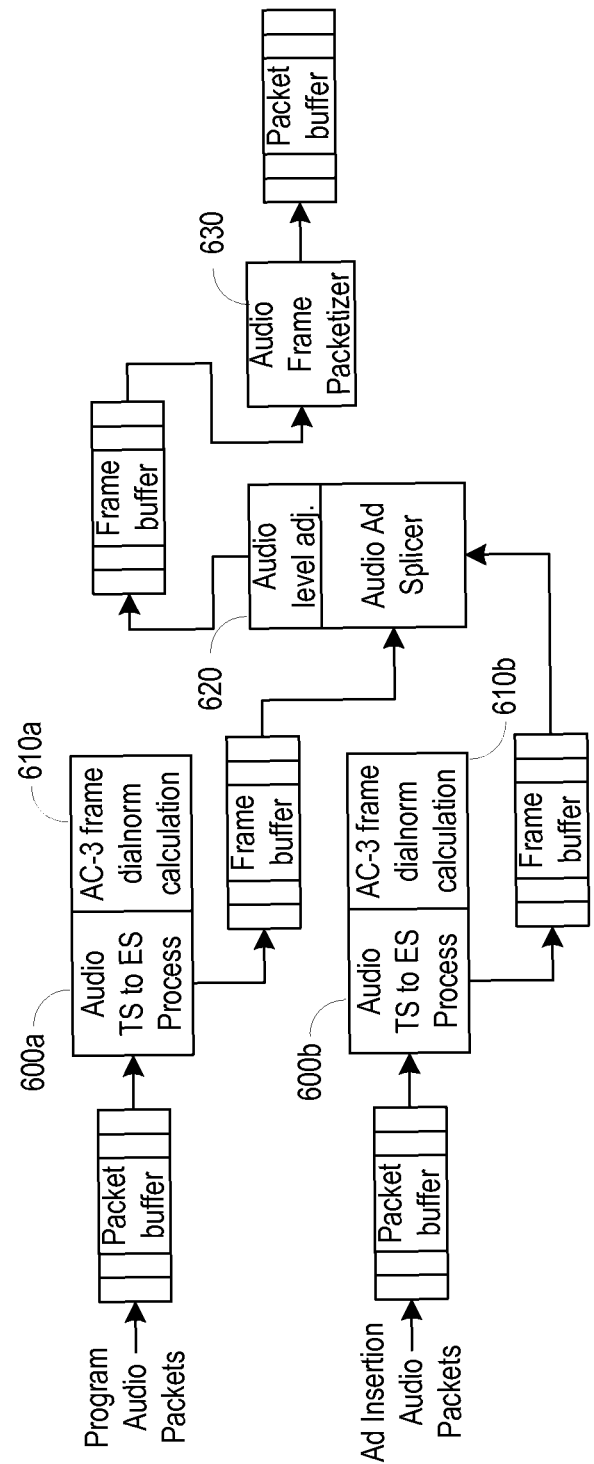
FIG. 6 is a block diagram of an example audio pipeline for audio normalization.

FIG. 6 is a block diagram illustrating an example of an audio pipeline with a dialnorm adjustment for program audio and for advertisement audio. For design simplicity purposes, all supported audio types (e.g., MPEG1L2, AC-3, AAC, etc.) can follow the same pipeline scheme. The previous transport packet forwarding based system can be used for non-audio type elementary streams.

The following is a brief description of each module depicted in the above diagram.

1. Audio TS to ES Module 600

This module receives audio transport packets and recreates the original audio frame from the packet payload. Each frame can carry a header information section that contains needed data about the frame such as frame length and type, presentation time (PTS), dialnorm value, and other attributes gleaned from the PES header.

2. AC-3 Frame Dialnorm Calculation Module 610

Before TS to ES module sends the frame downstream, if the frame is an AC-3 type audio and audio level normalization is enabled, it can calculate the estimated loudness level for this frame. The loudness level is an average value based on previous and look-ahead measurements.

3. Audio Level Adjustment Module 620

If the measured loudness is diverging from the encoded dialnorm level by more than a predetermined error, the dialnorm value shall be changed to reflect the actual loudness value.

For local content insertion, the dialnorm value of the main program at the time of insertion is used for comparison and adjustment of inserted AC-3 audio.

4. Audio Frame Packetizer 630

After the adjustments to the AC-3 audio from, using the MPEG2 transport standard guidelines the input audio frame is converted back to the transport packets.

Figure 7:
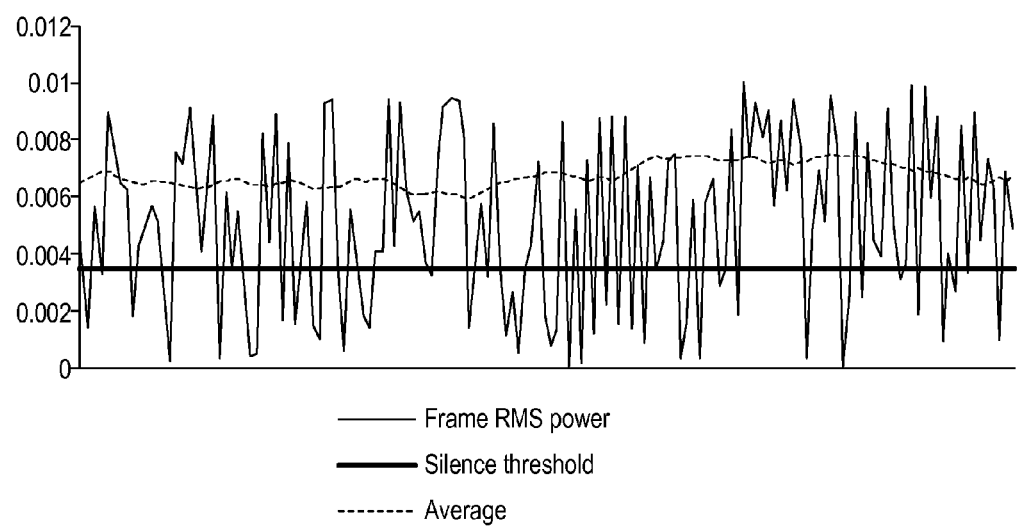
FIG. 7 is a graph depicting a moving average calculation for audio power level with silence rejection.

An example calculated moving average for an audio signal is shown in FIG. 7.

Figure 8:
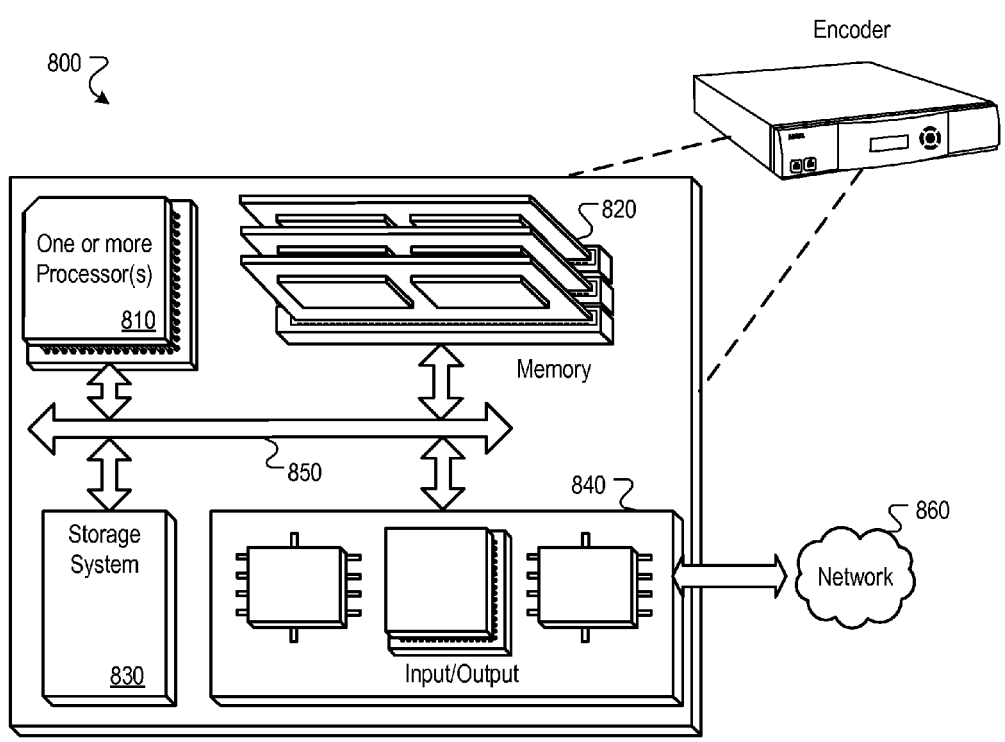
FIG. 8 is a component diagram of an example audio normalization system 800 operable to partially decode an audio stream to identify a dialnorm level for advertisements within a program.

FIG. 8 is a component diagram of an example audio normalization system 800 operable to partially decode an audio stream to identify a dialnorm level for advertisements within a program. The audio normalization system 800 can include a processor 810, a memory 820, a storage device 930, and an input/output device 840. Each of the components 810, 820, 830, and 840 can be interconnected, for example, using a system bus 850. The processor 810 is capable of processing instructions for execution within the system 800. In one implementation, the processor 810 is a single-threaded processor. In another implementation, the processor 810 is a multi-threaded processor. The processor 810 is capable of processing instructions stored in the memory 820 or on the storage device 830.

The memory 820 stores information within the device 800. In one implementation, the memory 820 is a computer-readable medium. In one implementation, the memory 820 is a volatile memory unit. In another implementation, the memory 820 is a non-volatile memory unit.

In some implementations, the storage device 830 is capable of providing mass storage for the device 800. In one implementation, the storage device 830 is a computer-readable medium. In various different implementations, the storage device 830 can include, for example, a hard disk device, an optical disk device, flash memory or some other large capacity storage device.

The input/output device 840 provides input/output operations for the device 800 to interface to a network 860. In one implementation, the input/output device 840 can interface to a content delivery network or a content source network. In addition, such input/output device 840 can communicate with other external devices through various interfaces such as, for example, an IP network interface device, e.g., an Ethernet card, a cellular network interface, a serial communication device, e.g., and RS-232 port, and/or a wireless interface device, e.g., and 802.11 card. In another implementation, the input/output device can include driver devices configured to receive input data and send output data to other input/output devices, as well as sending communications to, and receiving communications from various networks (not shown).

The video presentation system of this disclosure, and components thereof, can be realized by instructions that upon execution cause one or more processing devices to carry out the processes and functions described above. Such instructions can, for example, comprise interpreted instructions, such as script instructions, e.g., JavaScript or ECMAScript instructions, or executable code, or other instructions stored in a computer readable medium.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "system processor" encompasses all apparatus, devices, and machines for processing data, including by way of example a programmable processor, a digital signal processor, a computer, or multiple processors or computers. The system processor can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification are performed by one or more programmable processors executing one or more computer programs to perform functions by operating on input data and generating output thereby tying the process to a particular machine (e.g., a machine programmed to perform the processes described herein). The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The elements of a computer typically include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile communications device, a telephone, a cable modem, a set-top box, a mobile audio or video player, or a game console, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be operable to interface with a computing device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multitasking and parallel processing may be advantageous.

What is claimed is:

1. A computer-implemented method, comprising:
    receiving a multimedia stream comprising an audio stream and a video stream;
    separating the audio stream from the video stream of the multimedia stream;
    partially decoding audio frames included in the audio stream of the multimedia stream, wherein partially decoding the audio frames comprises discontinuing the decoding after obtaining frequency band coefficients associated with the audio frames;
    calculating an average energy level of the partially decoded frames across a sampling period;
    comparing the average energy level of the partially decoded frames to a nominal energy level;
    modifying a dialnorm setting associated with the audio stream based upon the comparison; and
    reencoding the partially decoded audio frames for inclusion as a modified audio stream corresponding to the video stream.

2. The computer-implemented method of claim 1, wherein pulse code modulation values are not obtained prior to calculating an average energy level of the partially decoded frames.

3. The computer-implemented method of claim 1, wherein obtaining pulse code modulation values comprises a full decoding of the audio frames.

4. The computer-implemented method of claim 1, wherein partial decoding the audio frames is operable to conserve substantial processing overhead associated with decoding the audio frames.

5. The computer-implemented method of claim 1, wherein partially decoding the audio frames comprises partially decoding of an AC-3 frame structure to yield frequency band coefficients without pulse code modulation values.

6. The computer-implemented method of claim 5, wherein calculating an average energy level comprises calculating a loudness value based on the frequency band coefficients.

7. The computer-implemented method of claim 1, wherein the computer-implemented method is operable to normalize segments of the audio stream to conform to a constant overall television station audio level.

8. The computer-implemented method of claim 7, wherein audio segments associated with an advertisement are normalized to audio segments associated with a main program segment.

9. The computer-implemented method of claim 1, wherein the computer-implemented method is operable to normalize segments of audio streams from different channels in a channel lineup to conform to a normalized audio level.

10. A system, comprising:
   a transport stream conversion module operable to receive audio packets and produce an AC-3 elementary stream associated with the audio packets;
   an AC-3 dialnorm calculation module operable to analyze the AC-3 elementary stream, partially decode the AC-3 elementary stream to derive frequency coefficients associated with the AC-3 elementary stream, and to calculate a loudness value associated with the AC-3 elementary stream based on the frequency coefficients, wherein pulse code modulation values are not obtained prior to calculating a loudness level of the partially decoded frames;
   an audio level adjustment module operable to receive the calculated loudness factor and compare the calculated loudness factor to an encoded dialnorm level, to determine whether the calculated loudness value is diverging from the encoded dialnorm level, and to adjust the encoded dialnorm level if the calculated loudness value diverges from the encoded dialnorm level by more than a predetermined amount.

11. The system of claim 10, wherein the partially decode of AC-3 elementary stream comprises discontinuing the decoding after obtaining frequency band coefficients associated with the audio frames.

12. The system of claim 10, wherein partially decoding the AC-3 elementary stream to derive frequency coefficients associated with the AC-3 elementary stream is operable to conserve substantial processing overhead associated with fully decoding the AC-3 elementary stream.

13. The system of claim 10, wherein the system comprises a program audio chain associated with a program audio stream and an ad audio chain associated with an advertisement audio stream, and wherein the audio level adjustment module is further operable to splice advertisements into the program audio stream to maintain a relatively constant loudness value.

14. A computer-implemented method, comprising:
   receiving a multimedia stream comprising an audio stream and a video stream;
   separating the audio stream from the video stream of the multimedia stream;
   partially decoding audio frames included in the audio stream of the multimedia stream, wherein pulse code modulation values are not obtained as a result of the partial decoding of the audio frames;
   calculating an average energy level of the partially decoded frames across a sampling period;
   comparing the average energy level of the partially decoded frames to a nominal energy level;
   modifying a dialnorm setting associated with the audio stream based upon the comparison; and
   reencoding the partially decoded audio frames for inclusion as a modified audio stream corresponding to the video stream.

15. The computer-implemented method of claim 14, wherein obtaining pulse code modulation values comprises a full decoding of the audio frames.

16. The computer-implemented method of claim 14, wherein partial decoding the audio frames is operable to conserve substantial processing overhead associated with decoding the audio frames.

17. The computer-implemented method of claim 14, wherein partially decoding the audio frames comprises partially decoding of an AC-3 frame structure to yield frequency band coefficients without pulse code modulation values.

18. The computer-implemented method of claim 17, wherein calculating an average energy level comprises calculating a loudness value based on the frequency band coefficients.

19. The computer-implemented method of claim 14, wherein the computer-implemented method is operable to normalize segments of the audio stream to conform to a constant overall television station audio level.

20. The computer-implemented method of claim 19, wherein audio segments associated with an advertisement are normalized to audio segments associated with a main program segment.

21. The computer-implemented method of claim 14, wherein the computer-implemented method is operable to normalize segments of audio streams from different channels in a channel lineup to conform to a normalized audio level.

* * * * *